United States Patent [19]

Sato

[11] 4,119,813
[45] Oct. 10, 1978

[54] CASSETTE TAPE RECORDER WITH DETACHABLE COUPLING TO RADIO

[75] Inventor: Masanobu Sato, Hachioji, Japan

[73] Assignee: Olympus Optical Company Ltd., Tokyo, Japan

[21] Appl. No.: 794,829

[22] Filed: May 9, 1977

Related U.S. Application Data

[62] Division of Ser. No. 639,271, Dec. 10, 1975, Pat. No. 4,041,250.

[30] Foreign Application Priority Data

Dec. 23, 1974 [JP] Japan .............................. 50-155007
Dec. 27, 1974 [JP] Japan .............................. 49-157061
Dec. 28, 1974 [JP] Japan .............................. 50-002698

[51] Int. Cl.² .......................... G11B 31/00; H04B 1/20
[52] U.S. Cl. .................................. 179/100.11; 339/40; 360/137
[58] Field of Search .................. 360/137; 179/100.11; 325/311; 339/40, 42

[56] References Cited

U.S. PATENT DOCUMENTS 3,899,795  8/1975  Watanabe ........................ 179/100.11
3,916,122  10/1975  Sato et al. ........................ 179/100.11

Primary Examiner—Raymond F. Cardillo, Jr.
Attorney, Agent, or Firm—Ostrolenk, Faber, Gerb & Soffen

[57] ABSTRACT

A coupling device comprises a pair of coupling channels formed in the both lateral sides of a compact cassette tape recorder, and a pair of rails formed on a part of a radio set for engagement with the channels, allowing the cassette tape recorder to be detachably coupled with the radio set. When not coupled, apertures provided in the tape recorder for connection terminals are covered by a coverplate, which uncovers these apertures by a sliding movement as the tape recorder is coupled with the radio set, thus enabling an electrical connection with the latter. The compact tape recorder can be detachably coupled with an accessory unit such as a tuner, a microphone pre-amplifier or the like by a single mounting threaded stud.

5 Claims, 14 Drawing Figures

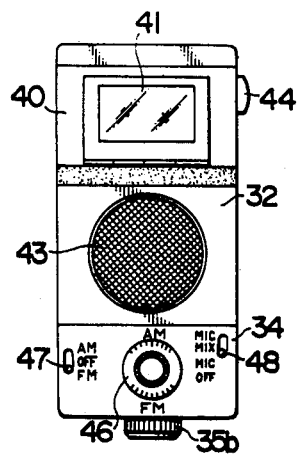
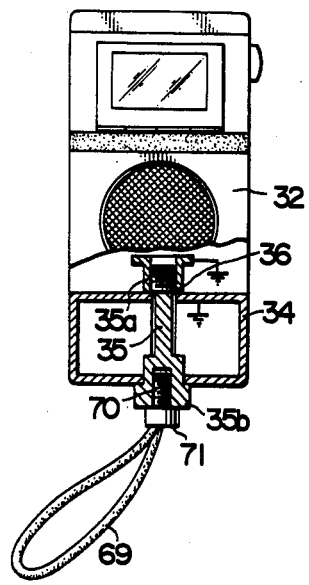
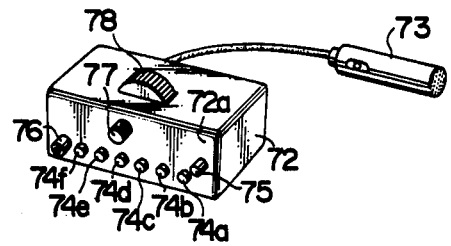
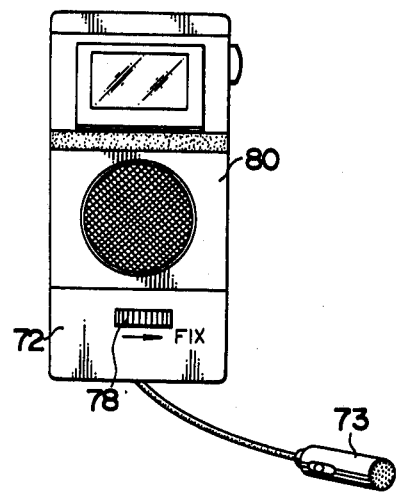
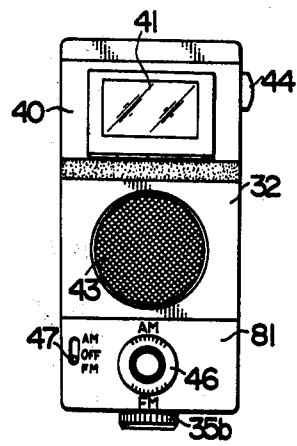

CASSETTE TAPE RECORDER WITH DETACHABLE COUPLING TO RADIO

This is a division of pending application Ser. No. 639,271, filed Dec. 10, 1975, now U.S. Pat. No. 4,041,250.

BACKGROUND OF THE INVENTION

The invention relates to a coupling device for cassette tape recorders, and more particularly to a coupling device for coupling a compact cassette tape recorder with a radio set or an accessory unit such as a tuner, a microphone pre-amplifier to provide an integrally joined assembly.

The prior art practice of coupling a tape recorder with a radio set has been by an electrical cord. However, such coupling represents a time and labor consuming operation, the coupled assembly has been disorderly and the connection is unsightly and is not susceptible to portable use.

With the advent of tape cassettes, a cassette tape recorder for use therewith has been constructed in an increasingly smaller size. In particular, a miniature cassette tape recorder, which is intended for use with a micro-cassette of a size comparable to a packet of matches and which has been developed by the present applicant, is constructed in a size which can be received in the pocket of a suit or shirt. The use of the electrical cord or an like to couple such a miniature cassette tape recorder with a radio set or other electroacoustic instrument would be unfavorable, and it is desirable to provide a coupling device which mechanically connects both units while providing an electrical connection therebetween. However, in the construction of such a coupling device, the electrical contacts provided on either instrument are externally exposed, particularly when a pin and socket connection is employed, and it is necessary to avoid a poor electrical connection which may be caused as by the ingress of dust, dirt or the like into the socket opening. Thus it is seen that some means be desirably provided to close the socket opening when the recorder is not coupled with another electroacoustic instrument.

On the other hand, the application of a miniature cassette tape recorder could be extended by allowing an accessory such as a tuner, a microphone pre-amplifier or the like to be coupled therewith in a simple manner. Specifically, every tape recorder is provided with a magnetic head, an amplifier and a loudspeaker so that an output signal from a tuner may be amplified to drive the loudspeaker of the recorder, thus enabling the recorder to be used as a radio set. When the recorder is in its record mode, a mixed recording can be achieved for an output signal from a tuner and an input signal from its internally housed microphone. Additionally, if a microphone pre-amplifier is coupled with a recorder, high quality recording can be accomplished by using an external microphone.

To enable the miniature cassette tape recorder to be used in a variety of applications, it is highly desirable that the associated accessory can be easily coupled with the tape recorder. It is also desirable that the electrical circuit within the recorder can be fully utilized when it is coupled with another instrument. By way of example, it is desirable that the connection with the tape recorder be such that when a tuner is coupled therewith, a power source contained within the recorder may feed power to the tuner while when the recorder is operated as a radio set, the microphone internally housed within the recorder is disabled.

SUMMARY OF THE INVENTION

It is an object of the invention to provide a coupling device for a cassette tape recorder, and in particular, a miniature version thereof, which may be coupled with a radio set while avoiding the use of an electrical cord, by providing a physically simple structure which permits a direct connection therebetween.

It is another object of the invention to provide a coupling device for cassette tape recorder which may be directly coupled with a radio set and including a number of socket contacts for connection with pin contacts provided on a portion of the radio set, the socket contacts being covered by a coverplate when the recorder is not coupled with the radio set, thus preventing the ingress of dust and dirt into the socket opening.

It is a further object of the invention to provide a coupling device for a cassette tape recorder, and particularly, a miniature version thereof, which permits a simple, accurate and detachable connection thereof with an accessory unit such as a tuner, a microphone pre-amplifier or the like, through a single mounting stud.

It is still another object of the invention to provide a coupling device for a cassette tape recorder, and in particular, a miniature version thereof, which is adapted to be coupled with a tuner in a manner such that the electrical circuit contained within the tape recorder may be effectively connected with the electrical circuit contained within the tuner.

According to the invention, there is provided a coupling device for a cassette tape recorder which permits the recorder to be detachably and securely coupled with the radio set through a single action operation while avoiding the use of an electrical cord, which arrangement prevents the ingress of dust and dirt into socket contacts provided on a portion of the recorder and which additionally permits connection of the recorder with an accessory unit in a simple manner through a single mounting stud so that the electrical circuit of the both units can be quickly and effectively connected together.

BRIEF DESCRIPTION OF THE DRAWINGS

FIG. 8 is a front view of the miniature cassette tape recorder and the tuner both shown in FIG. 6, when coupled together;

FIG. 9 is a view similar to FIG. 8, and illustrating certain parts in cross section;

FIG. 10 is a perspective view of the microphone-preamplifier unit;

FIG. 11 is a front view of the microphone-preamplifier unit shown in FIG. 10 as coupled with the miniature cassette tape recorder;

FIG. 12 is a front view of another tuner shown coupled with the miniature cassette tape recorder;

DETAILED DESCRIPTION OF PREFERRED EMBODIMENTS

Figure 1:
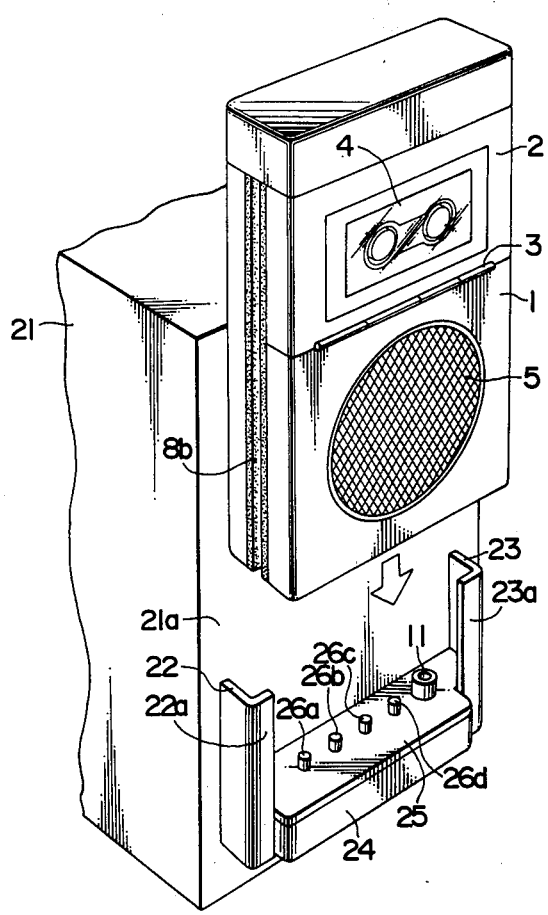
FIG. 1 is a perspective view of a coupling device constructed in accordance with one embodiment of the invention which permits a miniature cassette tape recorder to be coupled with a radio set.
Figure 3:
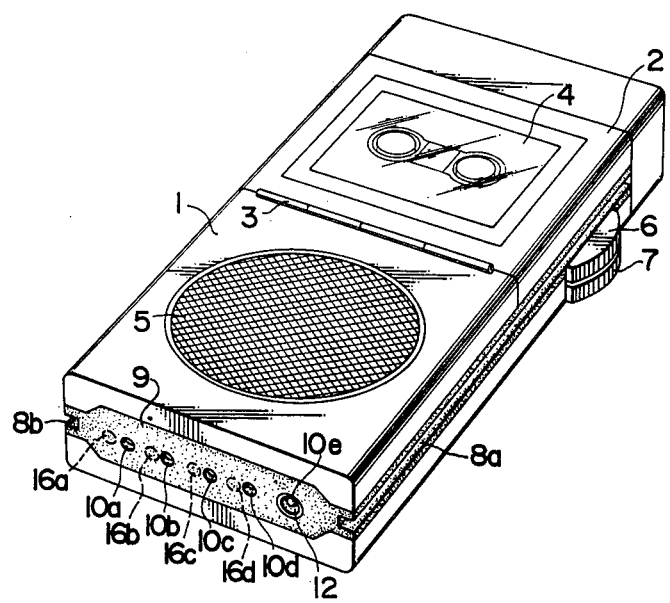
FIG. 3 is a perspective view of the miniature cassette tape recorder shown in FIG. 1, particularly illustrating the electrical contacts provided thereon.

In the description to follow, the cassette tape recorder is of a miniature type developed by the present applicant and having a size which can be entirely received in the pocket of a suit or a shirt. As shown in FIGS. 1 and 3, the miniature cassette tape recorder is elongate in configuration, and includes a cassette receiving chamber in its top surface. The chamber is normally covered by a lid 2 which is pivotally mounted on a hinge 3, and which is provided with a transparent window 4 through which the tape presence and tape running can be observed.

The tape recorder 1 is formed with a grille 5 for a loudspeaker contained therein, and is provided with a record button 6 and a playback button 7 in the right-hand sidewall thereof, as shown in FIG. 3.

Figure 4:
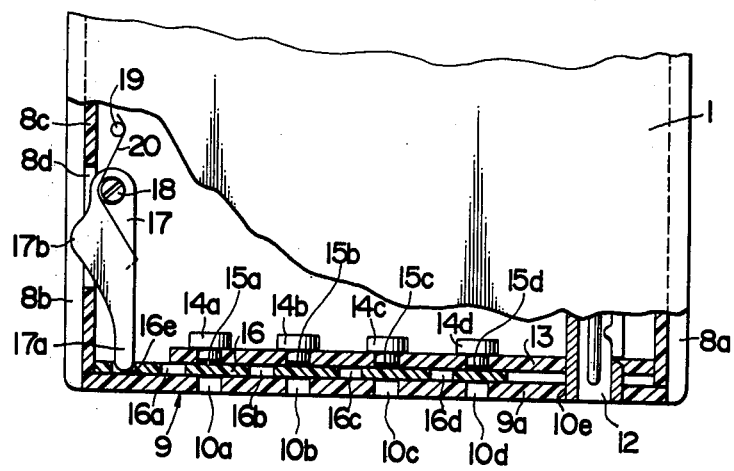
FIG. 4 is a fragmentary enlarged cross section of the cassette tape recorder shown in FIG. 3, particularly illustrating the arrangement of the socket contacts formed therein and a coverplate which covers these contacts.

In accordance with the invention, the lateral sidewalls of the recorder 1 are formed to provide a pair of coupling channels 8a, 8b which extend substantially over the length of the recorder for mating engagement with rails provided on the part of the radio set, as will be further described later. As indicated in FIG. 3, the recorder 1 includes a bottom surface 9 in which a plurality of apertures 10a to 10e are formed to receive connection terminals or pin contacts extending from a radio set when the recorder is coupled with the radio set. As shown in FIG. 4, one of the apertures, 10e, has a jack 12 disposed therein which engages a plug 11 (see FIGS. 1 and 5) provided on a portion of the radio set, as will be described later, thereby feeding the electrical circuit of the tape recorder 1 from a high capacity power source, not shown, contained within the radio set.

A terminal board 13 is disposed inwardly from the bottom surface 9, and is formed with a plurality of openings in alignment with the respective apertures 10a to 10d and into which are fitted a plurality of electrical terminals 14a to 14d for securement therein. The terminals 14a to 14d and the apertures 10a to 10d form together a plurality of recessed socket contact assemblies 15a to 15d, which are adapted to be engaged by pin contacts provided on the aforesaid portion of the radio set. Terminals 14a to 14d are connected with associated circuit portions of the electrical circuit of the tape recorder.

An intermediate coverplate 16 for closing the apertures 10a to 10d when the recorder is not coupled with another instrument is slidably disposed in the space between the terminal board 13 and bottom wall 9a which defines the bottom surface 9. The coverplate 16 is formed with a plurality of openings 16a to 16d of the same diameter as and at the same spacing as the apertures 10a to 10d. When the recorder 1 is not coupled with another instrument, the coverplate 16 is caused to be moved to the left as shown in FIG. 4, by a rocking pawl member 17, so that the openings 16a to 16d are displaced from the apertures 10a to 10d to close the latter with the coverplate 16, thus preventing the ingress of dust and dirt into these apertures.

The rocking pawl member 17 is pivotally mounted at 18 adjacent to the left-hand sidewall 8c (see FIGS. 4 and 5) of the tape recorder 1 and includes one end 17a which extends toward the bottom wall 9a to be engaged with an opening 16e which is formed in the coverplate 16 toward the left-hand sidewall 8c. Intermediate its length, the pawl member 17 is formed with a cam edge 17b on the side nearer the sidewall 8c, which cam edge is adapted to be engaged by one of the rails provided on the radio set to rock the pawl member 17 about the pivot 18 to thereby move the coverplate 16 to a position in which the openings 16a to 16d are aligned with and thereby serve to expose the apertures 10a to 10d when the recorder 1 is coupled with the radio set. A torsion spring 20 is disposed on the pivot 18 and has its one end engaged with the member 17 and its other end engaged with a stationary pin 19, thus biasing the member 17 to rock clockwise, so that normally, that is when the recorder is not coupled with the radio set, the member 17 rocks clockwise to displace the coverplate 16 into abutment against the sidewall 8c, causing the cam edge 17b to project into the coupling channel 8b through a slot 8d formed in the sidewall 8c.

As shown in FIG. 1, a radio set 21 includes a coupling surface 21a on which a pair of parallel rails 22, 23 are fixed. The rails 22, 23 extend longitudinally and are spaced apart by a distance which approximately corresponds to the width of the tape recorder 1. Each rail 22, 23 is L-shaped in cross section, and respectively includes a folded edge portion 22a, 23a, which is adapted to engage the coupling channels 8a, 8b of the tape recorder 1.

Figure 5:
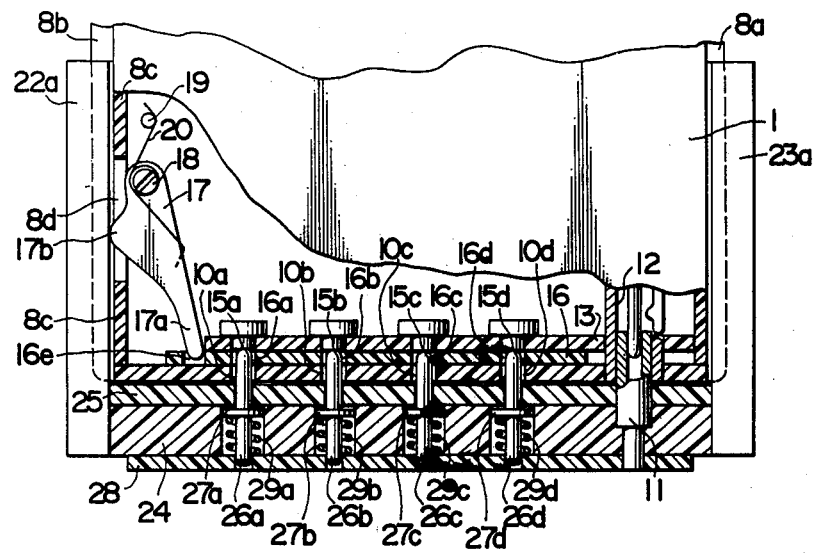
FIG. 5 is a fragmentary enlarged cross section of the cassette tape recorder shown in FIGS. 1, 3 and 4 as coupled with the radio set, particularly indicating the electrical connection between the contacts.

At the lower end of the rails 22, 23, an insulating member 24 for mounting electrical terminals of the radio set 21 thereon and an abutment plate 25 are integrally secured to the coupling surface 21a so as to extend between the rails 22, 23. The abutment plate 25 bears against the tape recorder 1 as it is coupled, and the insulating member 24 carries a plurality of pin contacts 26a to 26d which are adapted to engage the socket contacts 15a to 15d in the tape recorder 1, as well as a plug 11 which is adapted to engage the jack 12 (see FIGS. 3 to 5). As shown in FIG. 5, each of the pin contacts 26a to 26d comprises a pin received in a bore formed in the insulating member 24, and a spring which resiliently supports the pin. The free end of each pin extends through an aligned bore in the abutment plate 25 and projects above it for mating engagement with each of the socket contacts 15a to 15d. Specifically, each pin is formed with a flange 27a to 27d intermediate its length, and a spring 29a to 29d extends between the flange 27a to 27d and a support plate 28 which is disposed below and in overlapping relationship with the insulating member 24. It will be appreciated that the pins of the respective pin contacts 26a to 26d are connected with certain portions of the electrical circuit contained within the radio set 21.

In order to couple the tape recorder 1 with the radio set 21, it is only necessary to align the coupling channels 8a, 8b of the tape recorder 1 with the rails 22, 23 and to slide the body of the tape recorder 1 downwardly along the coupling surface 21a of the radio set 21. As the body of the tape recorder 1 slides, the cam edge 17b, which projects into the coupling channel 8b bears against the folded edge 22a of the rail 22, whereby the rocking pawl member 17 is rocked counter-clockwise about the pivot 18 against the bias applied by the torsion spring 20. As it rocks, the coverplate 16 engaged by the end 17a thereof is moved to the right until the openings 16a to 16d are aligned with the apertures 10a to 10d. Thereupon, the apertures 10a to 10d are free to receive the pin contacts 26a to 26d provided on the part of the radio set 21 for electrical contact with the socket contacts 15a to 15d. When the tape recorder 1 is slid to a given position in which the bottom surface 9 of the recorder 1 bears against the abutment plate 25, the pin contacts 26a to 26d projects through the open apertures 10a to 10d and openings 16a to 16d into electrical contact with the socket contacts 15a to 15d, thus connecting the electrical circuit of the radio set 21 with the electrical circuit of the tape recorder 1. In this manner, the miniature cassette tape recorder can be coupled with the radio set in a very simple and accurate manner.

Figure 2:
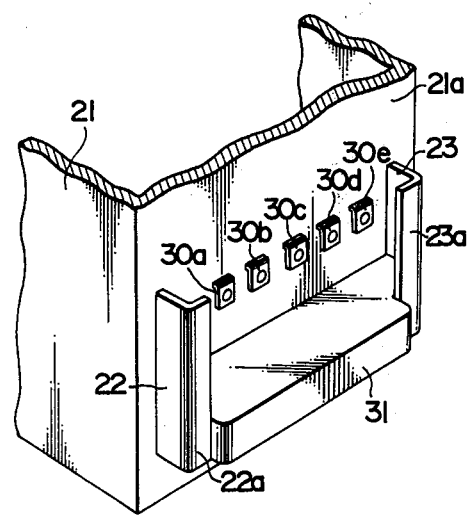
FIG. 2 is a perspective view of another form of electrical contacts provided on the part of the radio set.

While in the embodiment described above, the contacts provided on the part of the radio set 21 comprise pin contacts 26a to 26d which are mounted in the insulating member 24, it should be understood that they can be formed by resilient blade contacts 30a to 30e shown in FIG. 2, which are mounted on the coupling surface 21a above an abutment plate 31, for mating engagement with corresponding electrical contacts provided on the rear surface of the tape recorder.

Figure 6:
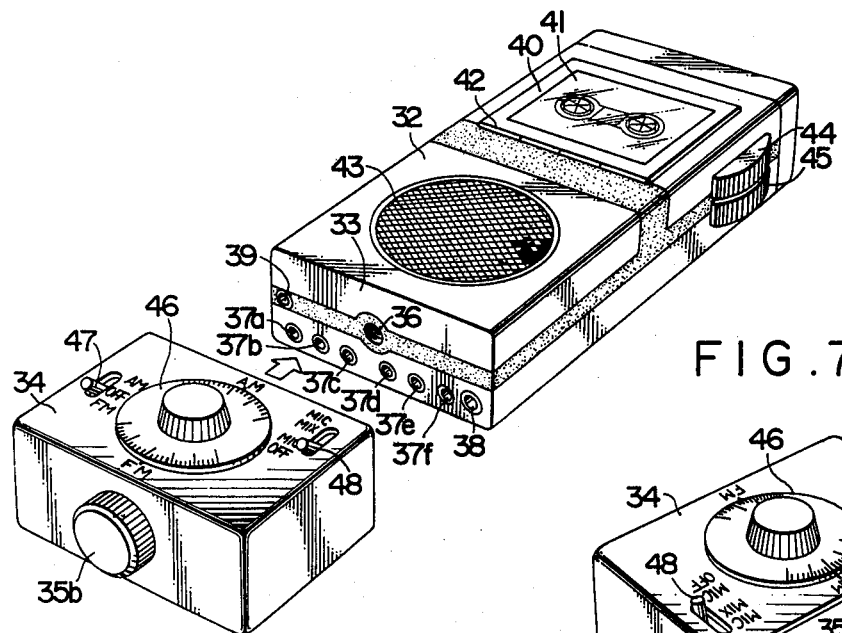
FIG. 6 is a perspective view of the miniature cassette tape recorder as constructed in accordance with the invention and a tuner which may be connected therewith as an accessory unit.
Figure 7:
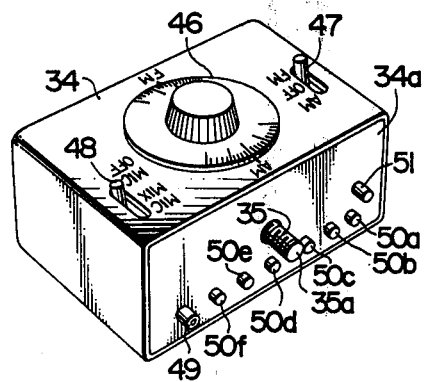
FIG. 7 is a perspective view of the tuner shown in FIG. 6, particularly illustrating its coupling surface.

Referring to FIGS. 6 and 7, there is shown another embodiment of the coupling device which is adapted for connection with a small portable tuner as an accessory unit. Specifically, a miniature cassette tape recorder 32 includes a bottom surface 33 which is centrally formed with a threaded bore 36 for threadable engagement with a free end 35a of a connection screw 35 which extends through and is rotatably carried by a tuner 34. The screw 35 has its end 35a projecting through the central region of the coupling surface 34a of the tuner 34, and has an opposite end or head 35b which is exposed through the surface located opposite to the coupling surface 34a. The head 35b may be turned to rotate the screw 35.

Disposed in the bottom surface 33 toward the rear surface of the tape recorder 32 are a plurality of socket contacts 37a to 37f which are aligned with each other and adapted to connect the electrical circuit of the recorder 32 with the electrical circuit of the tuner 34. A jack 38 is disposed to the right of the contact 37f for power source connection. A locating recess 39 is disposed adjacent to the left-most contact 37a. In the top region, the recorder is provided with a cassette receiving chamber which is usually closed by a lid 40 having a transparent window 41 and hinged at 42. In addition, the recorder is shown as including a grille 43 for an internally housed loudspeaker, and a record button 44 and a playback button 45.

The tuner 34 has a box-shaped casing, on the top panel of which is mounted a tuning dial 46. A change-over switch 47 for selection of either AM and FM broadcasting and a switch 48 are mounted on the opposite sides of the dial 46. The function of the switch 48 is to enable and disable a microphone which is internally housed within the tape recorder 32. At its bottom, the coupling surface 34a of the tuner 34 (see FIG. 7) is provided with a plurality of pin contacts 50a to 50f which are aligned with each other and adapted to be brought into electrical contact with the socket contacts 37a to 37f of the recorder 32 to provide an electrical connection between the tuner 34 and the recorder 32 when the latter is coupled with the tuner 34. A plug 49 is located adjacent to the contact 50f for mating engagement with the jack 38 (see FIG. 6). A locating pin 51 is disposed adjacent to the right-hand contact 50a, as viewed in FIG. 7, for mating engagement with the locating recess 39 (see FIG. 6).

Figure 13:
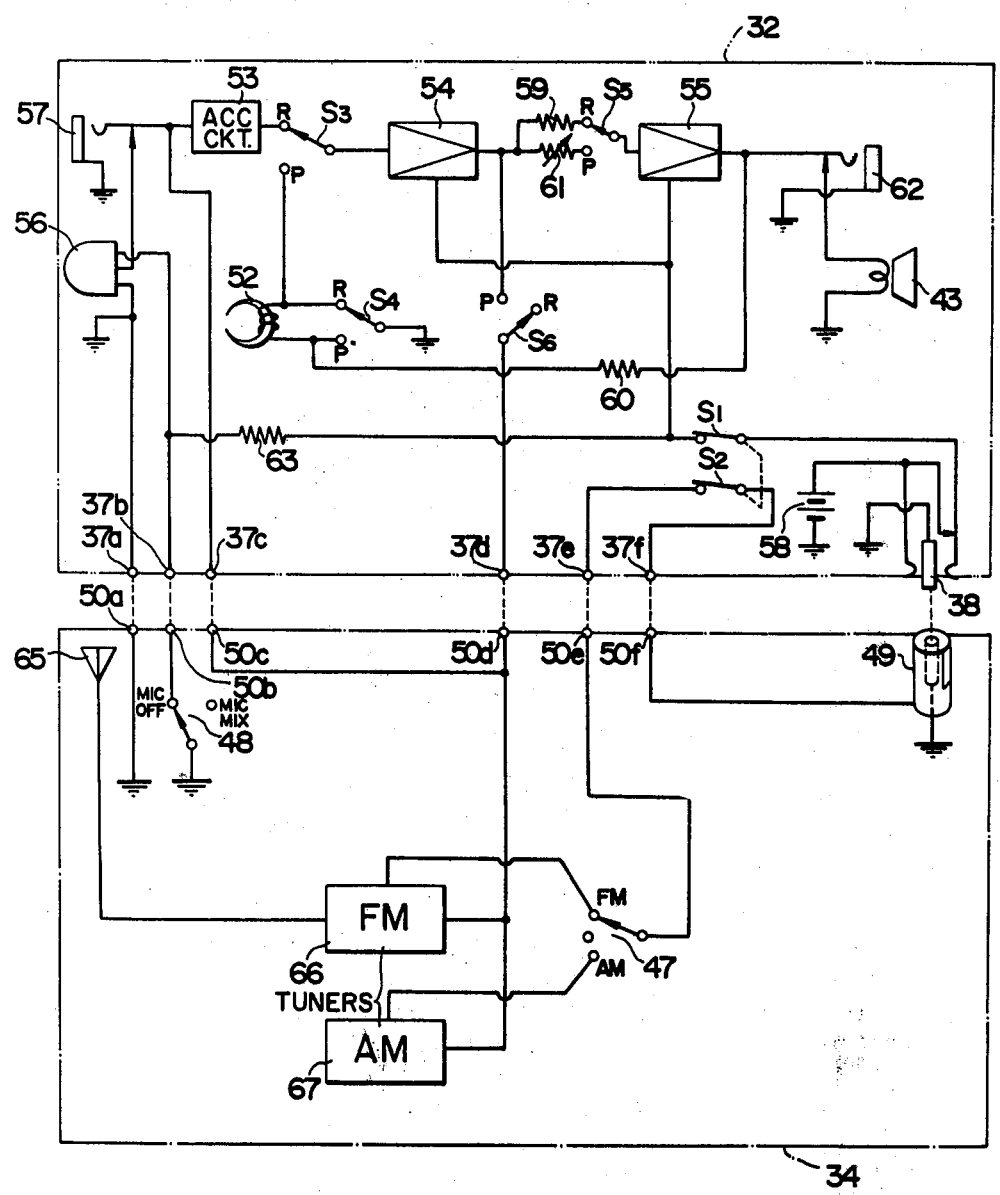
FIG. 13 is a circuit diagram of the electrical circuit formed by the miniature cassette tape recorder and the tuner shown in FIG. 8.

The electrical circuit of the miniature cassette tape recorder 32 and the tuner 34 is shown diagrammatically in FIG. 13. Specifically, the electrical circuit of the recorder 32 is indicated in a block which is enclosed by dot chain lines, and principally includes a record/playback head 52, AGC (automatic gain control) circuit 53, amplifier 54, 55, a loudspeaker 43, an internally housed microphone 56, a jack 57 for connection with an external microphone and a power source 58. The recorder also includes a pair of power switches $S_1$, $S_2$ and a plurality of change-over switches $S_3$ to $S_6$ which are operated in accordance with the operation of the record and playback buttons 44, 45 (FIG. 6). The change-over switches $S_3$ to $S_6$ each have their movable contact thrown to engage a stationary contact R during a record mode. Thus, when an input signal to be recorded is supplied by an external microphone, not shown, connected with the jack 57 or by the internally housed microphone 56, the signal is passed through AGC circuit 53 and the switch $S_3$ to be amplified by the amplifier 54, and thence fed through a resistor 59 and the switch $S_5$ to the amplifier 55. After amplification in the amplifier 55, the signal is fed through a resistor 60 to the head 52 to be recorded on a magnetic tape which is contained in the cassette load in the cassette receiving chamber of the recorder.

During a playback mode, the movable contact of the switches $S_3$ to engage $S_6$ is thrown to a stationary contact P, whereby an output signal which is reproduced from the tape by the head 52 is fed through the switch $S_3$ to be amplified by the amplifier 54, and thence fed through a variable resistor 61 and the switch $S_5$ to the amplifier 55. The amplified output signal from the amplifier 55 is supplied through an earphone jack 62 to the loudspeaker 43. The variable resistor 61 represents a volume control.

The described circuit is fed from an internally housed power source 58. Specifically, the source 58 is connected through the jack 38 (see FIG. 6) and through the power switch $S_1$ with the amplifiers 54 and 55, and also connected through a resistor 63 with a positive terminal of the microphone 56.

The described circuit is connected with the socket contacts 37a to 37f in the following manner: The contact 37a is connected with a negative terminal of the microphone 56 which is connected with the ground; the contact 37b is connected with the positive terminal of the microphone 56; the contact 37c is connected with an input terminal of the AGC circuit 53; the contact 37d is connected with the movable contact of the switch $S_6$; and the contacts 37e and 37f are connected across the power switch $S_2$ which is ganged with the power switch $S_1$.

The electrical circuit of the tuner 34 is shown in a block enclosed by dot chain lines in FIG. 13, and principally comprises an antenna 65, an FM tuner 66, an AM tuner 67, the change-over switches 47, 48 mentioned above, and the plug 49. The pin contacts 50a to 50f (see FIG. 7) of the tuner are connected with this electrical circuit in the following manner: The contact 50a is connected with the ground reference; the contact 50b is connected with a MIC OFF terminal of the change-over switch 48; the contacts 50c and 50d are connected together and connected with an output terminal of the FM and AM tuners 66, 67; the contact 50e is connected with the movable contact of the switch 47; and the contact 50f is connected with the plug 49. The antenna 65 is provided for intercepting an FM wave, and is connected with an input terminal of the FM tuner 66, which is fed through the switch 47 as is the AM tuner 67. The movable contact of the switch 48 is connected with the ground.

When coupling the cassette tape recorder 32 with the tuner 34, it is only necessary to place the locating pin 51 of the tuner 34 in opposite relationship with the locating recess 39 of the tape recorder 32, and to turn the head 35b of the connection screw 35 to screw its free end 35a into the threaded bore 36. Thereupon, the tuner 34 is indexed to a precise coupling position by the cooperation between the pin 51 and the recess 39, providing a coupled assembly as shown in FIG. 8. When the recorder is coupled with the tuner, the pin contacts 50a to 50f of the tuner 34 are brought into electrical contact with the socket contacts 37a to 37f of the recorder 32, whereby their electrical circuits are connected together. The engagement of the plug 49 with the jack 38 connects the power source 58 of the recorder 32 with the electrical circuit of the tuner 34 through the contacts 50f, 37f, the power switch $S_2$ and the contacts 37e, 50e, whereby the tuner 34 is fed from the power source contained within the recorder 32.

With the recorder coupled with the tuner as shown in FIG. 8, an FM broadcasting wave can be received by establishing a playback mode for the recorder 32, changing the switch 48 to MIC OFF terminal and throwing the switch 47 to the FM contact. Then, an output signal from the FM tuner 66 is fed through the contacts 50d, 37d, switch $S_6$ and the variable resistor 61 to the amplifier 55 which amplifies the tuner signal to feed the loudspeaker 43. In this manner, the combination of the recorder 32 and the tuner 34 constitutes an FM radio set. When the change-over switch 47 is thrown to the AM contact, the output signal from the AM tuner 67 is fed through the same path to be given off by the loudspeaker 43, whereby an AM radio set is provided.

When the tape recorder 32 is placed in a record mode and the switch 48 is thrown to MIC MIX contact, the microphone 56 is disconnected from the ground, and is therefore enabled for operation. Since the switch $S_6$ is thrown to engage stationary contact R, an output signal from the FM or AM tuner is fed through the contacts 50c, 37c to the AGC circuit 53, so that a mixed recording is possible when there is an input from the microphone 56. In this manner, the application of the recorder 32 is extended by connecting it with the tuner 34.

As shown in FIG. 9, the head 35b of the screw 35 may be formed with a threaded bore 70 for attaching a sling 69 by threadably engaging it with a sling attaching screw 71, for the convenience of carrying about the assembly.

FIG. 10 shows a microphone pre-amplifier unit 72 which may be used as an accessory unit to the cassette tape recorder of the invention. The pre-amplifier 72 is adapted to cooperate with an external microphone 73 for amplifying an output therefrom and feeding it to a record input circuit within the tape recorder. Specifically, the pre-amplifier unit includes a coupling surface 72a in which are disposed a plurality of pin contacts 74a to 74f which provide for electrical connection with the electrical circuit of the tape recorder, as well as a locating pin 75 and a power source connection plug 76. A connection screw 77 is rotatably supported within the casing of the pre-amplifier 72 and has its one end projecting centrally through the coupling surface 72a. The screw 77 is associated with a rotatable knob 78 for turning it, the screw, the knob being partially exposed through the top panel of the casing. By placing the coupling surface 72a of the pre-amplifier 72 in opposite relationship with the bottom of the tape recorder 80 which represents its coupling surface, and turning the knob 78, the pre-amplifier 72 is coupled with the recorder 80 as shown in FIG. 11, and a high positioning accuracy is achieved by the provision of the pin 75 and the screw 77.

Figure 14:
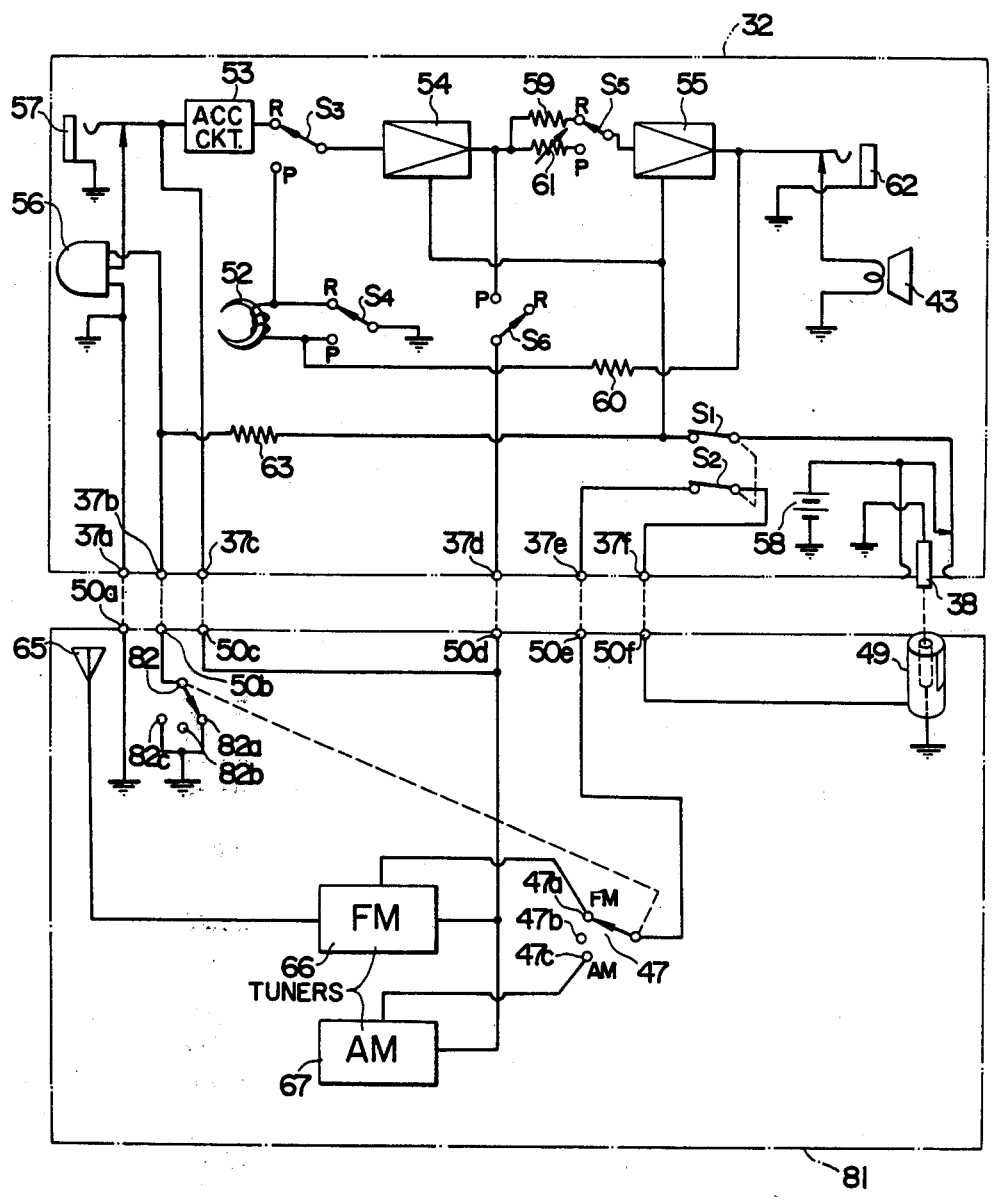
FIG. 14 is a circuit diagram of the electrical circuit formed by the miniature cassette tape recorder and the tuner shown in FIG. 12.

FIG. 12 shows a tuner 81 of an alternate construction which is shown as coupled with the cassette tape recorder 32 mentioned above. The coupling mechanism of the tuner 81 is constructed entirely in the same manner as the embodiment shown in FIGS. 6, 7, 8 and 13, employing a single connection screw. The electrical contacts provided thereon are similar in construction to the embodiment of FIGS. 6 to 8 and 13. However, the electrical circuit within the tuner 81 is slightly modified from that of the previous embodiment, as illustrated in FIG. 14. Specifically, in the electrical circuit of the tuner 81, the change-over switch 47 which selects either FM or AM broadcasting is ganged with a switch 82 which enables or disables an internally housed microphone of the tape recorder 32. Each of these switches comprises a three position switch. The switch 82 includes a movable contact which is connected with the pin contact 50b, and also includes three stationary contacts 82a, 82b and 82c, of which the contacts 82a and 82c are connected with the ground while the middle contact 82b is isolated. Thus, the microphone internally housed within the tape recorder 32 is only enabled when the movable contact is thrown to engage the middle contact 82b. The change-over switch 47 also includes a middle contact 47b which is isolated, while one of its other contacts, 47a, is connected to feed the FM tuner 66 while the other stationary contact 47c is connected to feed the AM tuner 67. In other respects, the arrangement is similar to that of the tuner 34 shown in FIG. 13.

When the tuner 81 is coupled with the tape recorder 32, the tuner 81 remains inoperative when the switch 82 is thrown to the contact 82b to establish the record mode of the tape recorder 32. Also, when the switch 47 is thrown to either contact 47a or 47c for reception of an FM or AM broadcasting wave, the tape recorder 32 cannot be placed in a record mode, thus preventing a mixed recording. Such an arrangement of the electrical circuit of the tuner 81 is effective to avoid the influence of unintended noises sensed by the microphone 56 of the tape recorder 32 upon the reproduction of a radio signal when the tuner 81 is coupled with the tape recorder 32, thus enabling the latter to be utilized as a high quality reproducing unit.

What is claimed is:

1. A coupling device for cassette tape recorder comprising a pair of coupling channels formed in both lateral sidewalls of a cassette tape recorder, a pair of rails formed on a coupling surface of radio set and adapted to engage the coupling channels for detachably mounting the tape recorder on the coupling surface of the radio set, a plurality of apertures formed in a bottom surface of the tape recorder, a plurality of socket contacts disposed within the respective apertures and connected with an electrical circuit of the tape recorder, a plurality of pin contacts mounted on an insulating member secured to the coupling surface of the radio set so as to extend between the pair of rails and adapted to be brought into electrical contact with the socket contacts to provide an electrical connection between an electrical circuit of the radio set and that of the tape recorder when the latter is coupled with the radio set, a coverplate having a plurality of openings extending therethrough and disposed for a sliding movement along the bottom surface of the tape recorder, the openings in the coverplate being disposed in a manner corresponding to the arrangement of the apertures in the bottom surface of the tape recorder, and a rockable pawl member pivotally mounted within the tape recorder and having a free end which engages the coverplate and a cam edge which projects into one of the coupling channels, means biasing the pawl member to urge its cam edge to project into the coupling channel and to move the coverplate to a position in which the openings therein are misaligned with the apertures to thereby substantially conceal the socket contacts, the cam edge being engaged and driven by one of the rails to rock the pawl member against the force of the bias means so that the coverplate is moved to a position in which the openings therein are aligned with the apertures when the tape recorder is physically coupled with the radio set.

2. A coupling device according to claim 1 in which each of the plurality of pin contacts are formed by an electrically conductive pin which is resiliently mounted on the insulating member.

3. A coupling device according to claim 1 in which each of the plurality of socket contacts comprises an electrically conductive terminal secured to a terminal board.

4. A coupling device according to claim 1 in which the rockable pawl member is bias means a torsion spring.

5. A coupling device according to claim 1 in which the cam edge is formed by a lateral extension which is provided intermediate the length of the pawl member.

* * * * *